United States Patent
Lee et al.

(10) Patent No.: US 10,043,432 B2
(45) Date of Patent: Aug. 7, 2018

(54) EMISSION DRIVER AND DISPLAY DEVICE INCLUDING THE SAME

(71) Applicant: Samsung Display Co., LTD., Yongin-si, Gyeonggi-do (KR)

(72) Inventors: Seung-Kyu Lee, Asan-si (KR); Ji-Su Na, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 80 days.

(21) Appl. No.: 15/047,502

(22) Filed: Feb. 18, 2016

(65) Prior Publication Data

US 2017/0004771 A1    Jan. 5, 2017

(30) Foreign Application Priority Data

Jul. 2, 2015 (KR) .................. 10-2015-0094922

(51) Int. Cl.
| | | |
|---|---|---|
| *G09G 3/3266* | (2016.01) | |
| *G09G 3/3258* | (2016.01) | |
| *G09G 3/20* | (2006.01) | |
| *G09G 3/3233* | (2016.01) | |
| *G11C 19/18* | (2006.01) | |

(52) U.S. Cl.
CPC ............. *G09G 3/20* (2013.01); *G09G 3/3233* (2013.01); *G09G 3/3266* (2013.01); *G11C 19/184* (2013.01); *G09G 2300/0842* (2013.01); *G09G 2300/0861* (2013.01);
(Continued)

(58) Field of Classification Search
CPC .. G09G 3/3266; G09G 3/3233; G09G 3/3291; G09G 2310/0286; G09G 2310/0289; G09G 2310/0626; G09G 2320/045; G09G 2300/0861; G09G 2300/0842; G09G 2300/0819; G09G 3/20; G09G 3/3225; G09G 2310/0205; G09G 2330/021; G06F 3/147; G06F 3/0412;
(Continued)

(56) References Cited

U.S. PATENT DOCUMENTS

| | | | | |
|---|---|---|---|---|
| 8,339,424 | B2 * | 12/2012 | Jeong .................. | G09G 3/3266 345/211 |
| 9,113,534 | B2 * | 8/2015 | Kim ..................... | G11C 19/184 |

(Continued)

FOREIGN PATENT DOCUMENTS

| | | |
|---|---|---|
| KR | 10-2012-0077874 A | 7/2012 |
| KR | 10-2014-0025149 A | 3/2014 |

*Primary Examiner* — Dismery Mercedes
(74) *Attorney, Agent, or Firm* — Lewis Roca Rothgerber Christie LLP

(57) ABSTRACT

An emission driver includes light emission driving controllers that are electrically connected to light emission control lines. Each of the light emission driving controllers may include a first circuit block configured to provide a second voltage to a first node in response to a first clock signal and to output a first voltage as a light emission control signal based on a voltage at the first node and a second clock signal having a phase difference from a phase of the first clock signal; and a second circuit block configured to provide a synchronization signal to a second node in response to the first clock signal, to maintain a voltage at the second node using a metal-oxide-semiconductor (MOS) capacitor, and to pull down the light emission control signal to have the second voltage in response to the voltage at the second node.

16 Claims, 7 Drawing Sheets

(52) U.S. Cl.
CPC ............... *G09G 2310/0205* (2013.01); *G09G 2310/0267* (2013.01); *G09G 2310/0286* (2013.01)

(58) Field of Classification Search
CPC ....... G06F 3/0416; G06F 3/044; G11C 19/28; G11C 19/184; G11C 19/287; G11C 19/186
See application file for complete search history.

(56) References Cited

U.S. PATENT DOCUMENTS

| | | | | |
|---|---|---|---|---|
| 9,183,781 B2* | 11/2015 | Jang | ...................... | G09G 3/3266 |
| 9,277,622 B2* | 3/2016 | Kim | ....................... | H05B 37/02 |
| 9,368,069 B2* | 6/2016 | Woo | ....................... | G09G 3/3266 |
| 9,542,884 B2* | 1/2017 | Lin | ........................ | G11C 19/28 |
| 9,881,689 B2* | 1/2018 | Lee | ........................ | G11C 19/28 |
| 9,886,891 B2* | 2/2018 | In | ........................ | G09G 3/2096 |
| 2007/0063933 A1* | 3/2007 | Chung | ................ | G09G 3/3266 345/76 |
| 2009/0251392 A1* | 10/2009 | Kim | ...................... | G09G 3/3233 345/76 |
| 2010/0207968 A1* | 8/2010 | Kim | ...................... | G09G 3/3266 345/691 |
| 2011/0080393 A1* | 4/2011 | Kim | ...................... | G09G 3/3266 345/208 |
| 2012/0327131 A1* | 12/2012 | Jang | ...................... | G09G 3/3266 345/690 |
| 2013/0222352 A1* | 8/2013 | Jeong | ................... | G09G 3/3266 345/205 |
| 2013/0342584 A1* | 12/2013 | Song | ........................ | G09G 3/30 345/690 |
| 2014/0111092 A1* | 4/2014 | Kim | ....................... | H05B 37/02 315/127 |
| 2014/0285108 A1* | 9/2014 | Kim | ..................... | G11C 19/184 315/291 |
| 2016/0035262 A1* | 2/2016 | Lee | ........................ | G11C 19/28 345/690 |
| 2016/0055829 A1* | 2/2016 | Lin | ...................... | G09G 3/3233 345/213 |
| 2016/0133185 A1* | 5/2016 | Yoon | .................... | G09G 3/3266 345/76 |
| 2016/0141352 A1* | 5/2016 | Sung | .................... | G09G 3/3233 257/40 |
| 2016/0275845 A1* | 9/2016 | Tsai | ..................... | G09G 3/3266 |
| 2016/0379558 A1* | 12/2016 | Jeon | ..................... | G09G 3/3225 345/213 |

* cited by examiner

EMISSION DRIVER AND DISPLAY DEVICE INCLUDING THE SAME

CROSS-REFERENCE TO RELATED APPLICATIONS

This application claims priority under 35 USC § 119 to and the benefit of Korean Patent Application No. 10-2015-0094922, filed on Jul. 2, 2015 in the Korean Intellectual Property Office (KIPO), the contents of which are incorporated herein in its entirety by reference.

BACKGROUND

1. Field

Example embodiments relate to a display device. More particularly, embodiments of the present inventive concept relate to an emission driver and a display device having the emission driver.

2. Description of the Related Art

An organic light emitting display device displays an image using organic light emitting diodes to emit light by recombination of electrons and holes. The organic light emitting display device includes pixels, a scan driver for sequentially providing scan signals to the pixels, a data driver for providing data voltages to the pixels, and an emission driver for providing the pixels with light emission control signals to control a light emission time of the pixels.

In order to apply the organic light emitting display device to various suitable electronic devices (e.g., a mobile device operated using a battery), low power consumption of the organic light emitting display device is desired. In this regard, a technique that can reduce power consumption of the emission driver is desired.

SUMMARY

Some example embodiments provide an emission driver with reduced power consumption.

Some example embodiments provide a display device including the emission driver.

According to example embodiments, an emission driver may include a plurality of light emission driving controllers that are electrically connected to light emission control lines, where each of the light emission driving controllers may include a first circuit block configured to provide a second voltage to a first node in response to a first clock signal and to output a first voltage as a light emission control signal based on a voltage at the first node and a second clock signal having a phase difference from a phase of the first clock signal, and a second circuit block configured to provide a synchronization signal to a second node in response to the first clock signal, to maintain a voltage at the second node using a metal-oxide-semiconductor (MOS) capacitor, and to pull down the light emission control signal to have the second voltage in response to the voltage at the second node.

In example embodiments, the MOS capacitor may perform a coupling operation based on the voltage at the second node.

In example embodiments, the MOS capacitor may be a P-channel metal-oxide-semiconductor (PMOS) transistor.

In example embodiments, the MOS capacitor may include a gate electrode that is electrically connected to the second node, a first electrode that receives the second clock signal, and a second electrode that receives the second clock signal.

In example embodiments, the MOS capacitor may operate when the voltage at the second node has a logic low level.

In example embodiments, the first circuit block may include a first transistor including a gate electrode that receives the first clock signal, a first electrode that receives the second voltage, and a second electrode that is electrically connected to the first node, a first capacitor electrically connected between the first node and a third node, a second transistor including a gate electrode that is electrically connected to the first node, a first electrode that receives the second clock signal, and a second electrode that is electrically connected to the third node, a third transistor including a gate electrode that receives the second clock signal, a first electrode that is electrically connected to the third node, and a second electrode that is electrically connected to a fourth node, a fourth transistor including a gate electrode that is electrically connected to the fourth node, a first electrode that receives the first voltage, and a second electrode that is electrically connected to an output terminal, and a second capacitor electrically connected between the fourth node and the first electrode of the fourth transistor.

In example embodiments, the first circuit block may further include a fifth transistor including a gate electrode that is electrically connected to the second node, a first electrode that receives the first clock signal, and a second electrode that is electrically connected to the first node, and a sixth transistor including a gate electrode that is electrically connected to the second node, a first electrode that receives the first voltage, and a second electrode that is electrically connected to the fourth node.

In example embodiments, the second circuit block may include a seventh transistor including a gate electrode that receives the first clock signal, a first electrode that receives the synchronization signal, and a second electrode that is electrically connected to the second node, an eighth transistor including a gate electrode that is electrically connected to the first node, a first electrode that receives the first voltage, and a second electrode that is electrically connected to a fifth node, a ninth transistor including a gate electrode that receives the second clock signal, a first electrode that is electrically connected to the fifth node, and a second electrode that is electrically connected to the second node, and a tenth transistor including a gate electrode that is electrically connected to the second node, a first electrode that receives the second voltage, and a second electrode that is electrically connected to the output terminal, where the MOS capacitor may be electrically connected between the second node and a terminal that receives the second clock signal.

In example embodiments, the second capacitor may be a MOS capacitor.

In example embodiments, the MOS capacitor may be a PMOS transistor.

In example embodiments, the second capacitor may include a gate electrode that is electrically connected to the fourth node, a first electrode that receives the second voltage, and a second electrode that receives the second voltage.

According to example embodiments, an emission driver may include a plurality of light emission driving controllers that are electrically connected to light emission control lines, where each of the light emission driving controllers may include a first circuit block configured to charge a fourth node with a second voltage based on a first clock signal and a second clock signal having a phase difference from a phase of the first clock signal, to maintain a voltage at the fourth node using a metal-oxide-semiconductor (MOS) capacitor, and to output a first voltage as a light emission control signal based on the voltage at the fourth node, and a second circuit block configured to provide a synchronization signal to a second node in response to the first clock signal and to pull down the light emission control signal to have the second voltage in response to the voltage at the second node.

In example embodiments, the MOS capacitor may operate based on the voltage at the fourth node.

In example embodiments, the MOS capacitor may be a P-channel metal-oxide-semiconductor (PMOS) transistor.

In example embodiments, the MOS capacitor may include a gate electrode that is electrically connected to the fourth node, a first electrode that receives the first voltage, and a second electrode that receives the first voltage.

In example embodiments, the MOS capacitor may operate when the voltage at the fourth node has a logic low level.

In example embodiments, the first circuit block may include a first transistor including a gate electrode that receives the first clock signal, a first electrode that receives the second voltage, and a second electrode that is electrically connected to a first node, a first capacitor electrically connected between the first node and a third node, a second transistor including a gate electrode that is electrically connected to the first node, a first electrode that receives the second clock signal, and a second electrode that is electrically connected to the third node, a third transistor including a gate electrode that receives the second clock signal, a first electrode that is electrically connected to the third node, and a second electrode that is electrically connected to the fourth node, and a fourth transistor including a gate electrode that is electrically connected to the fourth node, a first electrode that receives the first voltage, and a second electrode that is electrically connected to an output terminal, where the MOS capacitor may be electrically connected between the fourth node and the first electrode of the fourth transistor.

In example embodiments, the first circuit block may further include a fifth transistor including a gate electrode that is electrically connected to the second node, a first electrode that receives the first clock signal, and a second electrode that is electrically connected to the first node, and a sixth transistor including a gate electrode that is electrically connected to the second node, a first electrode that receives the first voltage, and a second electrode that is electrically connected to the fourth node.

In example embodiments, the second circuit block may include a seventh transistor including a gate electrode that receives the first clock signal, a first electrode that receives the synchronization signal, and a second electrode that is electrically connected to the second node, an eighth transistor including a gate electrode that is electrically connected to the first node, a first electrode that receives the first voltage, and a second electrode that is electrically connected to a fifth node, a ninth transistor including a gate electrode that receives the second clock signal, a first electrode that is electrically connected to the fifth node, and a second electrode that is electrically connected to the second node, a third capacitor electrically connected between the second node and a terminal that receives the second clock signal, and a tenth transistor including a gate electrode that is electrically connected to the second node, a first electrode that receives the second voltage, and a second electrode that is electrically connected to the output terminal.

According to example embodiments, a display device may include a display panel including a plurality of light emission control lines and a plurality of pixels electrically connected to the light emission control lines, and a plurality of light emission driving controllers electrically connected to the light emission control lines, respectively, where each of the light emission driving controllers may include a first circuit block configured to provide a second voltage to a first node in response to a first clock signal and to output a first voltage as a light emission control signal based on a voltage at the first node and a second clock signal having a phase difference from a phase of the first clock signal, and a second circuit block configured to provide a synchronization signal to a second node in response to the first clock signal, to maintain a voltage at the second node using a MOS capacitor, and to pull down the light emission control signal to have the second voltage in response to the voltage at the second node.

Therefore, an emission driver according to example embodiments may reduce power consumption due to a periodic reversal of a second clock signal (i.e., toggling of the second clock signal) when a light emission control signal has a logic high level by maintain a voltage at a second node (i.e., a node that electrically connected to a gate electrode of a pulling-down transistor) using a metal-oxide semiconductor (MOS) transistor, where the MOS capacitor may not operate when the voltage at the second node has a logic high level and may be uncharged or discharged in response to the second clock signal.

A display device according to example embodiments may reduce power consumed during a driving of a pixel by including the emission driver.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1:
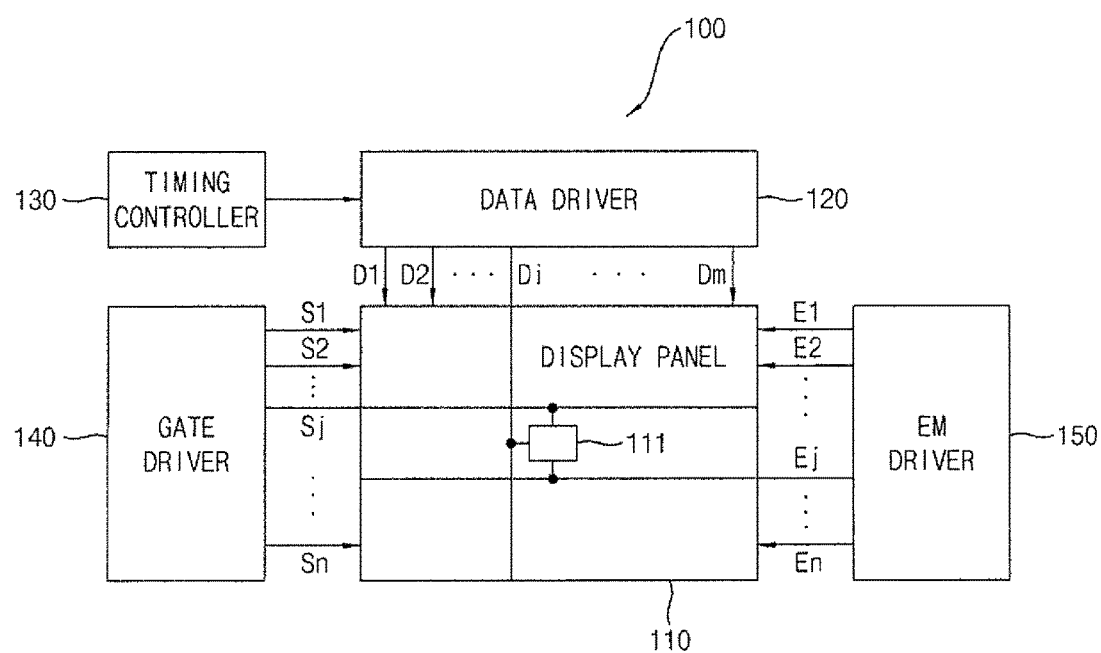
FIG. 1 is a block diagram illustrating a display device according to example embodiments.

Hereinafter, the present inventive concept will be explained in detail with reference to the accompanying drawings.

It will be understood that, although the terms "first", "second", "third", etc., may be used herein to describe various elements, components, regions, layers, and/or sections, these elements, components, regions, layers and/or sections should not be limited by these terms. These terms are used to distinguish one element, component, region, layer or section from another element, component, region, layer or section. Thus, a first element, component, region, layer, or section discussed below could be termed a second element, component, region, layer, or section, without departing from the spirit and scope of the present invention.

Further, it will also be understood that when one element, component, region, layer and/or section is referred to as being "between" two elements, components, regions, layers, and/or sections, it can be the only element, component, region, layer and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. Further "connection," "connected," etc. may also refer to "electrical connection," "electrically connect," etc. depending on the context in which they are used as those skilled in the art would appreciate. When an element or layer is referred to as being "directly on," "directly connected to," "directly coupled to," "directly connected with," "directly coupled with," or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

FIG. 1 is a block diagram illustrating a display device according to example embodiments.

Referring to FIG. 1, the display device 100 may include a display panel 110, a data driver 120, a timing controller 130, a scan driver 140 (e.g., a gate driver 140), and an emission driver 150.

The display device 100 may display an image based on image data provided from an outside. For example, the display device 100 may be an organic light emitting display device.

The display panel 110 may include scan lines S1 through Sn, data lines D1 through Dm, emission control lines E1 through En, and pixels 111 located at crossing regions of scan lines S1 through Sn and data lines D1 through Dm, where m and n are integers that are greater than or equal to 2.

Each of the pixels 111 may store a data signal provided through the data lines D1 through Dm in response to a scan signal provided through the scan lines S1 through Sn, and may emit light based on the stored data signal in response to a light emission control signal provided through the emission control lines E1 through En.

The data driver 120 may provide data signals to the display panel 110. The data driver 120 may generate the data signals based on image data provided from the timing controller 130 and may provide the data signals to the display panel 110 (i.e., the pixels 111) through the data lines D1 through Dm in response to a data driving control signal.

The timing controller 130 may control the data driver 120, the scan driver 140, and the emission driver 150. The timing controller 130 may generate the data driving control signal and may provide the data driving control signal to the data driver 120. The timing controller 130 may generate a scan driving control signal and may provide the scan driver 140 with the scan driving control signal. The timing controller 130 may generate the light emission control signal and may provide the light emission control signal to the emission driver 150.

The scan driver 140 may generate scan signals based on the scan driving control signal provided from the timing controller 130. The scan driver 140 may provide the scan signals (e.g., gate signals) to the pixel 111 through the scan lines S1 through Sn. Here, the scan driving control signal may include a start pulse and clock signals, and the scan driver 140 may include a shift register for sequentially generating the scan signals corresponding to the start pulse and the clock signals.

The emission driver 150 may receive a light emission driving control signal from the timing controller and may generate the light emission control signal based on the light emission driving control signal. The emission driver 150 may provide the light emission control signal to the pixel 111 through the light emission control lines E1 through En. Here, the light emission driving control signal may include a start signal and first and second clock signals, and the emission driver 150 may include light emission driving controllers that are electrically connected to the light emission control lines E1 through En, respectively.

In some example embodiments, each of the light emission driving controllers may maintain (or keep) a voltage provided to a gate electrode of a pull-down transistor by using a metal-oxide semiconductor (i.e., referred to as "MOS") capacitor. The MOS capacitor may perform a coupling operation when the light emission control signal having a logic low level is outputted, and may perform no operation when the light emission control signal having a logic high level (or a high voltage level, a turn-on voltage) is outputted. Therefore, the MOS capacitor may have no effect on a periodic reversal (or a toggling) of the second clock signal when the light emission control signal having a logic high level is outputted. Here, the MOS capacitor may be uncharged or discharged.

In some example embodiments, each of the light emission driving controllers may include a MOS capacitor for maintaining a control signal to output the light emission control signal having a logic high level. For example, a light emission driving controller may include a pull-up transistor for outputting the light emission control signal having a logic high level. Here, the MOS capacitor may be electrically connected to a gate electrode of the pull-up transistor, may operate when a control voltage supplied to a gate electrode of the MOS capacitor has a logic low level (or a low voltage level, a turn-off voltage), and may maintain the control voltage to a logic low level. The MOS capacitor may not be charged with the control voltage having a logic high level when the control voltage has a logic high level. Therefore, the power consumption may be reduced.

As shown in the display device 100 of FIG. 1, the emission driver 150 may be configured independently of the scan driver 140. However, the emission driver 150 is not limited thereto. For example, the light emission driver 150 may be included in the scan driver 140.

Figure 2:
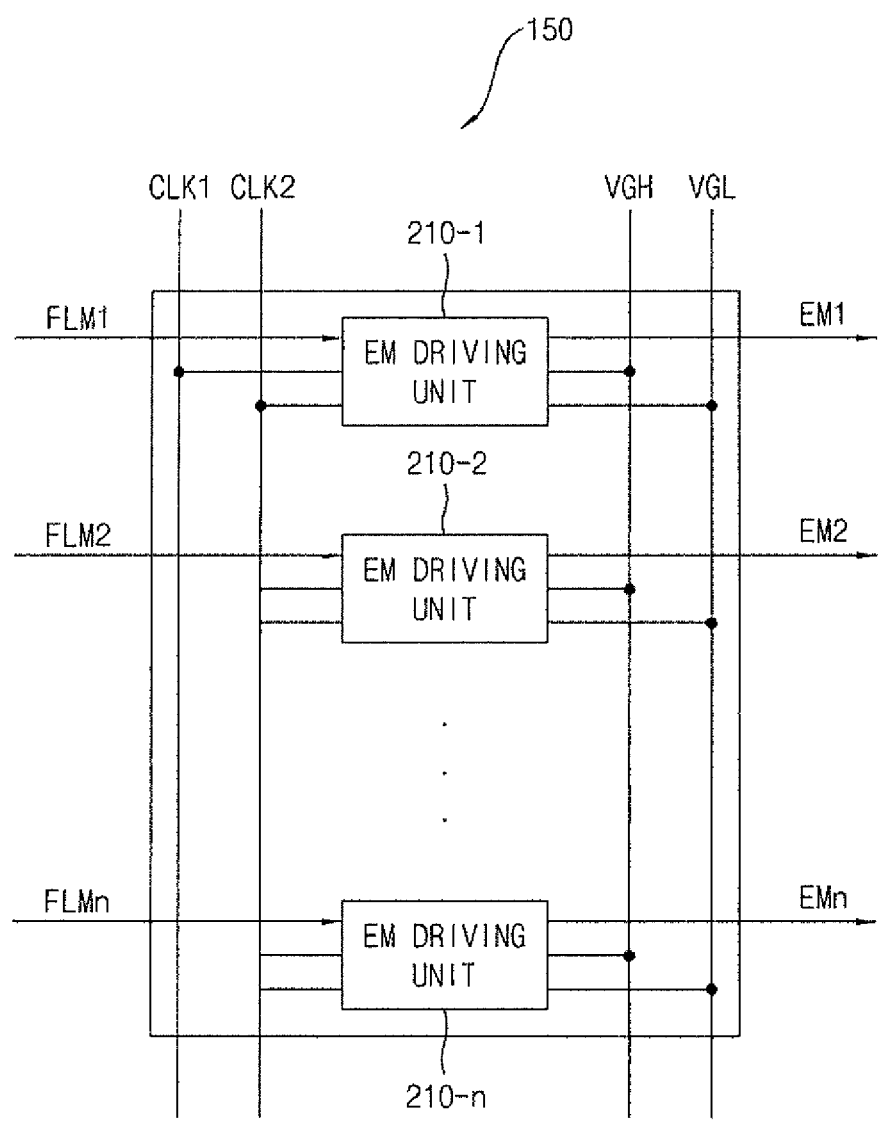
FIG. 2 is a diagram illustrating an example of an emission driver included in the display device of FIG. 1.
Figure 3:
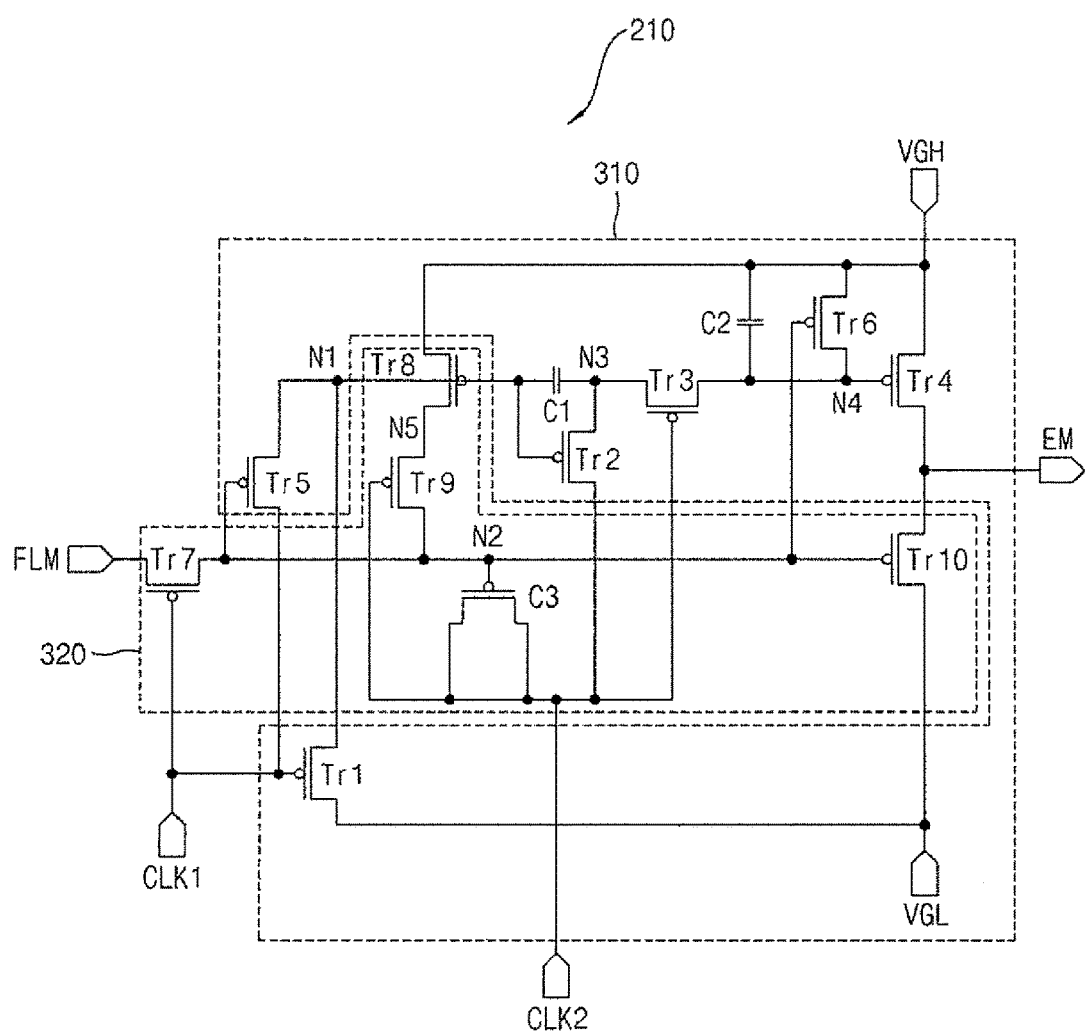
FIG. 3 is a circuit diagram illustrating an example of a light emission driving controller included in the emission driver of FIG. 2.

FIG. 2 is a diagram illustrating an example of an emission driver included in the display device of FIG. 1. FIG. 3 is a circuit diagram illustrating an example of a light emission driving controller included in the emission driver of FIG. 2.

Referring to FIGS. 2 and 3, the emission driver 150 may include light emission control lines and light emission driving controllers 210-1 through 210-n (e.g., EM driving units 210-1 through 210-n).

The light emission driving controllers 210-1 through 210-n may receive a start signal FLM, a first clock signal CLK1, a second clock signal CLK2, a first voltage VGH, and a second voltage VGL. The start signal FLM may include a pulse signal having a high level during some periods and may limit a large value of a driving current flowing through the pixel 111. Each of the first and second clock signals CLK1 and CLK2 may be generated by synchronizing the start signal FLM and may have the same or substantially the same frequency. The second clock signal CLK2 may have a certain phase difference from a phase of the first clock signal CLK1.

A first light emission driving controller 210-1 may generate a first light emission control signal EM1 based on a first start signal FLM1. A second light emission driving controller 210-2 may generate a second light emission control signal EM2 based on a second start signal FLM2. That is, an (n)th light emission driving controller 210-n may generate an (n)th light emission control signal EMn based on an (n)th start signal FLMn. As shown in FIG. 2, the (n)th light emission driving controller 210-n receives an (n)th start signal FLMn. However, the (n)th light emission driving controller 210-n is not limited thereto. For example, the (n)th light emission driving controller 210-n may receive an (n−1)th light emission control signal EMn−1 as the (n)th start signal FLMn.

The light emission driving controller 210 may charge a first node N1 with the second voltage VGL in response to the first clock signal CLK1, and may output the first voltage VGH as the light emission control signal EM based on the second clock signal CLK2 and a charged voltage at the first node N1. The light emission driving controller 210 may charge a second node N2 with the start signal FLM in response to the first clock signal CLK1, may maintain a charged voltage at the second node N2 by using a MOS capacitor C3, and may pull down the light emission control signal EM to have the second voltage VGL in response to the charge voltage at the second node N2.

In some example embodiments, the light emission driving controller 210 may include a first circuit block 310 to provide the second voltage VGL to the first node N1 in response to the first clock signal CLK1 and to output the first voltage VGH as the light emission control signal EM based on the second clock signal CLK2 and the charged voltage at the first node N1, and a second circuit block 320 to provide a synchronization signal to the second node N2 in response to the first clock signal CLK1, to maintain a stored voltage at the second node N2 using a MOS capacitor, and to pull down the light emission control signal EM to have the second voltage VGL in response to the stored voltage at the second node N2.

The MOS capacitor C3 may perform a coupling operation based on the stored voltage at the second node N2. For example, the MOS capacitor C3 may be implemented as a P-channel MOS (i.e., referred as to "PMOS"), and may include a gate electrode that is electrically connected to the second node N2, a first electrode that receives the second clock signal CLK2, and a second electrode that receives the second clock signal CLK2. The MOS capacitor C3 may perform the coupling operation in response to the stored voltage at the second node N2 having a logic low level. The MOS capacitor C3 may perform no operation in response to the stored voltage at the second node N2 having a logic high level.

As illustrated in FIG. 3, the first circuit block 310 may include first through sixth transistors TR1 through TR6, a first capacitor C1, and a second capacitor C2.

The first transistor TR1 may include a gate electrode that receives the first clock signal CLK1, a first electrode that receives the second voltage VGL, and a second electrode that is electrically connected to the first node N1. The first transistor TR1 may charge the first node N1 with the second voltage VGL in response to the first clock signal CLK1.

The first capacitor C1 may be electrically connected between the first node N1 and a third node N3, and may capacitively couple the first node N1 and the first node N3.

The second transistor TR2 may include a gate electrode that is electrically connected to the first node N1, a first electrode that receives a second clock signal CLK2, and a second electrode that is electrically connected to the third node N3. The second transistor TR2 may provide the second clock signal CLK2 to the third node N3 in response to a voltage at the first node N1.

The third transistor TR3 may include a gate electrode that receives a second clock signal CLK2, a first electrode that is electrically connected to the third node N3, and a second electrode that is electrically connected to a fourth node N4. The third transistor TR3 may connect the third node N3 to the fourth node N4 in response to the second clock signal CLK2.

The fourth transistor TR4 may include a gate electrode that is electrically connected to the fourth node N4, a first electrode that receives the first voltage VGH, and a second electrode that is electrically connected to an output terminal of the light emission driving controller 210. The fourth transistor TR4 may output the second voltage as the light emission control signal EM in response to a voltage at the fourth node N4.

The second capacitor C2 may be electrically connected between the fourth node N4 and the first electrode of the fourth transistor TR4, and may be charged with a voltage supplied at the fourth node N4. The second capacitor C2 may maintain the fourth transistor to be in a turn-on state based on a charged voltage.

Therefore, the first circuit block 310 may output the light emission control signal having a logic high level using the first through fourth transistors TR1 through TR4, and the first and second capacitors C1 and C2.

The fifth transistor TR5 may include a gate electrode that is electrically connected to the second node N2, a first electrode that receives the first clock signal CLK1, and a second electrode that is electrically connected to the first node N1. The fifth transistor TR5 may provide the first clock signal CLK1 to the first node N1 in response to a voltage at the second node N2.

The sixth transistor TR6 may include a gate electrode that is electrically connected to the second node N2, a first electrode that receives the first voltage VGH, and a second electrode that is electrically connected to the fourth node N4. The sixth transistor TR6 may provide the first voltage VGH to the fourth node N4 in response to a voltage at the second node N2. Here, the fourth transistor TR4 may be turned off in response to the first voltage VGH.

The second circuit block 320 may include seventh through tenth transistors TR7 through TR10 and a MOS capacitor C3.

The seventh transistor TR7 may include a gate electrode that receives the first clock signal CLK1, a first electrode that receives the start signal FLM (or the synchronization signal), and a second electrode that is electrically connected to the second node N2. The seventh transistor TR7 may provide the start signal FLM to the second node in response to the first clock signal CLK1.

The eighth transistor TR8 may include a gate electrode that is electrically connected to the first node N1, a first electrode that receives the first voltage VGH, and a second electrode that is electrically connected to a fifth node N5.

The ninth transistor TR9 may include a gate electrode that receives the second clock signal CLK2, a first electrode that is electrically connected to the fifth node N5, and a second electrode that is electrically connected to the second node N2. The eighth and ninth transistors TR8 and TR9 may provide the first voltage VGH to the second node N2 in response to a voltage at the first node N1 and the second clock signal CLK2, respectively.

The MOS capacitor C3 may be electrically connected between the second node N2 and a terminal for receiving the second clock signal CLK2. The MOS capacitor C3 may capacitively couple the second node N2 and the terminal for receiving the second clock signal CLK2. The MOS capacitor C3 may perform a coupling operation based on a charged voltage at the second node N2. The MOS capacitor C3 may perform the coupling operation in response to the charged voltage at the second node N2 having a logic low level. The MOS capacitor C3 may perform no operation in response to the charged voltage at the second node N2 having a logic high level (i.e., a voltage provided to the gate electrode of the MOS capacitor C3 having a logic high level).

The tenth transistor TR10 may include a gate electrode that is electrically connected to the second node N2, a first electrode that receives the second voltage VGL, and a second electrode that is electrically connected to an output terminal of the light emission driving controller 210. The tenth transistor TR10 may pull down the light emission control signal EM to have the second voltage VGL in response to a voltage at the second node N2.

As shown in FIG. 3, each of transistors included in the light emission driving controller 210 is a PMOS transistor. However, each of the transistors is not limited thereto. For example, each of the transistors may be an N-channel MOS (i.e., referred as to "NMOS") transistor.

In an example embodiment, the second capacitor C2 may be a MOS capacitor. For example, the second capacitor C2 may be a PMOS transistor. The second capacitor C2 may include a gate electrode that is electrically connected to the fourth node N4, a first electrode that receives the second voltage VGL, and a second electrode that receives the second voltage VGL. The second capacitor C2 may perform a coupling operation in response to the charged voltage at the second node N2 having a logic low level. The second capacitor C2 implemented as a MOS capacitor may be described in detail with reference to FIG. 6.

Figure 4:
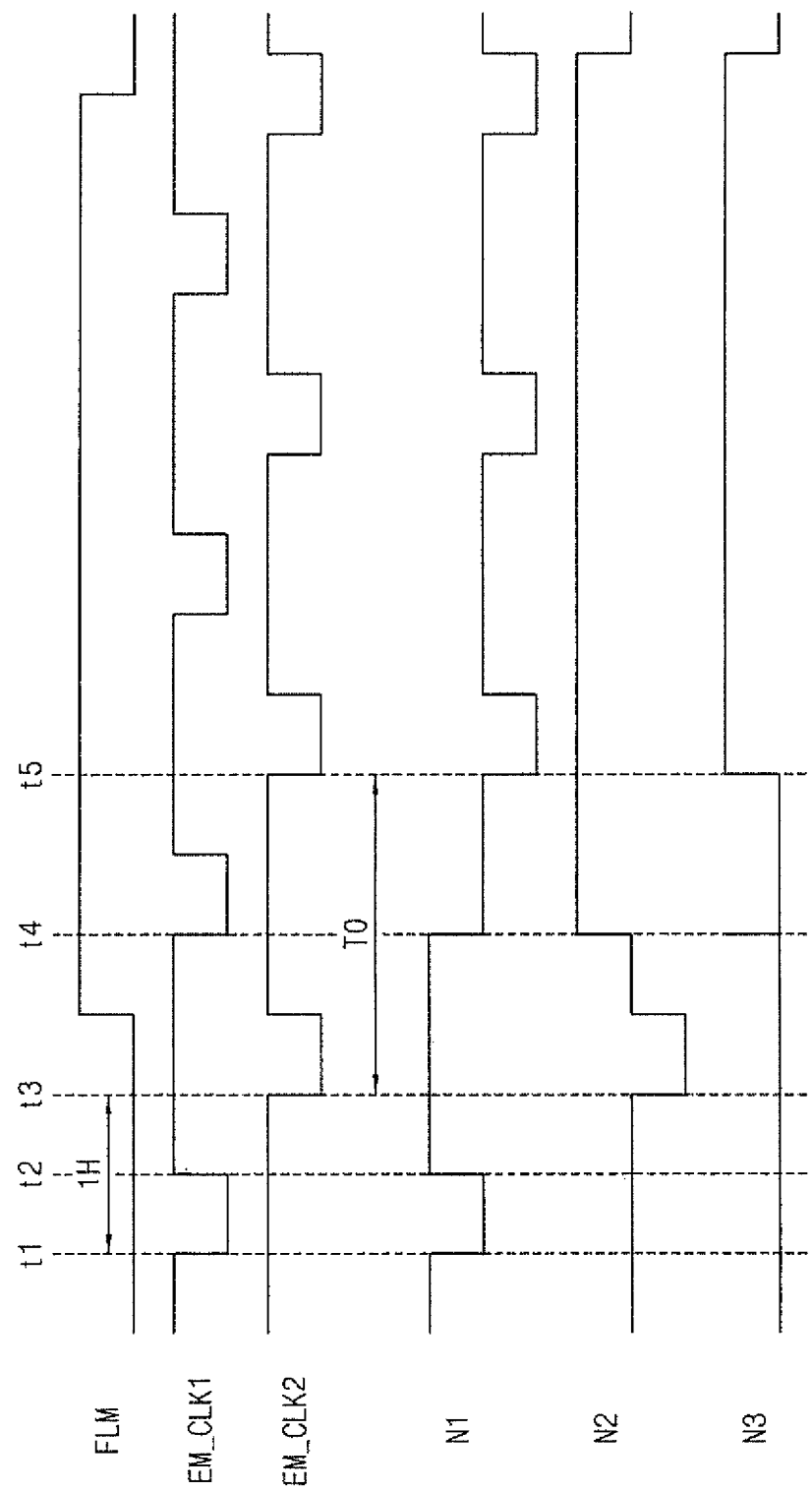
FIG. 4 is a waveform diagram for illustrating an operation of the light emission driving controller of FIG. 3.

FIG. 4 is a waveform diagram for illustrating an operation of the light emission driving controller of FIG. 3.

Referring to FIGS. 3 and 4, the first clock signal CLK1 and the second clock signal CLK2 may have the same or substantially the same period T0 (or cycle). The second clock signal CLK2 may be the first clock signal CLK1 shifted by a half period. A logic high level of the signals may be a first level, and a logic low level of the signals lower than the logic high level may be a second level. Here, the first voltage VGH may have the first level and the second voltage VGL may have the second level.

At a first point (or a first time) t1, the start signal FLM may have the second level, the first clock signal CLK1 may have the second level, and the second clock signal CLK2 may have the first level.

The seventh transistor TR7 and the first transistor TR1 may be turned on in response to the first clock signal having the second level, and the start signal FLM having the second level may be provided to a gate electrode of the fifth transistor TR5 and the second node N2. The fifth transistor TR5 may be turned on in response to the start signal FLM having the second level, and a voltage at the second node N2 may be the second level. The first clock signal CLK1 may be provided to the first node N1 through the fifth transistor TR5, and the second voltage VGL may be provided to the first node N1 through the first transistor TR1. Therefore, a voltage at the second node N2 may be the second level.

The ninth transistor TR9 and the third transistor TR3 may be turned off in response to the second clock signal CLK2 having the second level.

The sixth transistor TR6 may be turned on in response to a voltage at the second node N2 having the second level. The first voltage VGH may be provided to the fourth node N4 through the sixth transistor TR6, and a voltage at the fourth node N4 may be the first level. The second capacitor C2 may be charged with the first voltage VGH. The fourth transistor TR4 may be turned off in response to a voltage of the fourth node N4 having the first level.

The tenth transistor TR10 may be turned on in response to a voltage at the second node N2 having the second level. Therefore, the light emission control signal EM may have the second level.

At a second point t2, the start signal may have the second level, the first clock signal CLK1 may have the first level, and the second clock signal CLK2 may have the first level.

The seventh transistor TR7 and the first transistor TR1 may be turned off in response to the first clock signal CLK1 having the first level. Because a voltage at the second node N2 may be maintained (or kept) with the second level, the fifth transistor TR5 may be turned on. The first clock signal CLK1 having the first level may be provided to the first node N1 through the fifth transistor TR5. Therefore, a voltage at the first node N1 may be the first level.

The sixth transistor TR6 and the tenth transistor TR10 may be turned on in response to a voltage at the second node N2 having the second level. The first voltage VGH may be provided to the fourth node N4 through the sixth transistor TR6, and a voltage at the fourth node N4 may be maintained with the first level.

The fourth transistor TR4 may be turned off in response to a voltage at the fourth node N4 having the first level, the tenth transistor TR10 may be turned on in response to a voltage at the second node N2 having the second level. Therefore, the light emission control signal EM may be maintained with the second level.

At a third point t3, the second clock signal CLK2 may be changed from the first level to the second level, and between the third point t3 and the fourth point t4, the second clock signal CLK2 may be changed from the second level to the first level again. Therefore, a voltage at the second node N2 may be boosted (or bootstrapped) by a voltage variation of the second clock signal CLK2 due to a coupling of the MOS capacitor C3. That is, the second node N2 may have a third level lower than the second level by a coupling of the MOS capacitor C3. Generally, a PMOS transistor may have better driving characteristic by receiving lower voltage (or a voltage having a lower voltage level). Therefore, a driving characteristic of the sixth transistor TR6 and a driving characteristic of the tenth transistor TR10 may be improved based on a voltage at the second node N12 having the third level. Here, the light emission control signal EM may be maintained with the second level.

At a fourth point t4, the start signal FLM may have the first level, the second clock signal CLK2 may have the first level, and the first clock signal CLK1 may have the second level.

The seventh transistor TR7 may be turned on in response to the first clock signal CLK1 having the second level, and the start signal FLM having the first level may be provided to the second node N2. Therefore, a voltage at the second node N2 may have the first level. The fifth transistor TR5 and the tenth transistor TR10 may be turned off in response to a voltage at the second node N2.

The first transistor TR1 may be turned on in response to the first clock signal CLK1 having the second level, and the second voltage VGL may be provided to the first node N1. Therefore, a voltage of the first node N1 may have the second level.

The third transistor TR3 may be turned off in response to the second clock signal CLK2 having the first level, and the sixth transistor TR6 may be turned off in response to a voltage at the second node N2 having the first level. A voltage at the fourth node N4 may be maintained with the first level by the second capacitor C2. The fourth transistor TR4 may be turned off in response to a voltage at the fourth node N4 having the first level. Therefore, the light emission control signal EM may be maintained with the second level.

At a fifth point t5, the start signal may have the first level, the first clock signal CLK1 may have the first level, and the second clock signal CLK2 may have the second level.

The seventh transistor TR7 and the first transistor TR1 may be turned off in response to the first clock signal CLK1 having the first level, and a voltage at the second node N2 may be maintained with the first level. The fifth transistor TR5, the sixth transistor TR6, and the tenth transistor TR10 may be turned off in response to a voltage at the second node N2 having the first level.

The ninth transistor TR9 and the third transistor TR3 may be turned on in response to the second clock signal CLK2 having the second level, and the eighth transistor TR8 and the second transistor TR2 may be turned on in response to a voltage at the first node N1 having the second level. Here, a voltage at the first node N1 may be boosted (or bootstrapped) by a voltage variation of the second clock signal CLK2 due to a coupling of the second capacitor C2. That is, a voltage at the first node N1 may have the third level lower than the second level.

The second clock signal CLK2 having the second level may be provided to the fourth node N4 through the second transistor TR2 and the third transistor TR3. Therefore, a voltage at the fourth node N4 may have the second level. The fourth transistor TR4 may be turned on in response to a voltage at the fourth node N4 having the second level. Because the fourth transistor TR4 may be turned on and the tenth transistor TR10 may be turned off, the light emission control signal EM may have the first level.

The MOS capacitor C3 may perform no operation according to a voltage at the second node N2 having the first level. When the MOS capacitor C3 performs as a capacitor, the MOS capacitor may be charged according to a voltage across the MOS capacitor C3 (i.e., the first level—the second level). Therefore, consumption of current from the first voltage VGH may be caused by the ninth transistor TR9 and the eighth transistor TR8.

Because the MOS capacitor included in the emission driver according to example embodiments may perform no operation in response to a voltage at the second node N2 having the second level, the MOS capacitor C3 may be uncharged. Therefore, no consumption of current from the first voltage VGH may be caused by the ninth transistor TR9 and the eighth transistor TR8.

As described above, the light emission driving controller 210 may include the MOS capacitor C3, and the MOS capacitor C3 may perform no operation when a voltage at the second node N2 has the first level. Therefore, no consumption of current from the first voltage VGH may be caused by the ninth transistor TR9 and the eighth transistor TR8 even when the second clock signal CLK2 is reversed periodically (or toggled) (for example, reversed from a logic high level to a logic low level) when the light emission control signal EM is maintained with the first level. Therefore, the light emission driving controller 210 may reduce power consumption due to a capacitor when the light emission control signal EM is maintained with the first level.

Figure 5A:
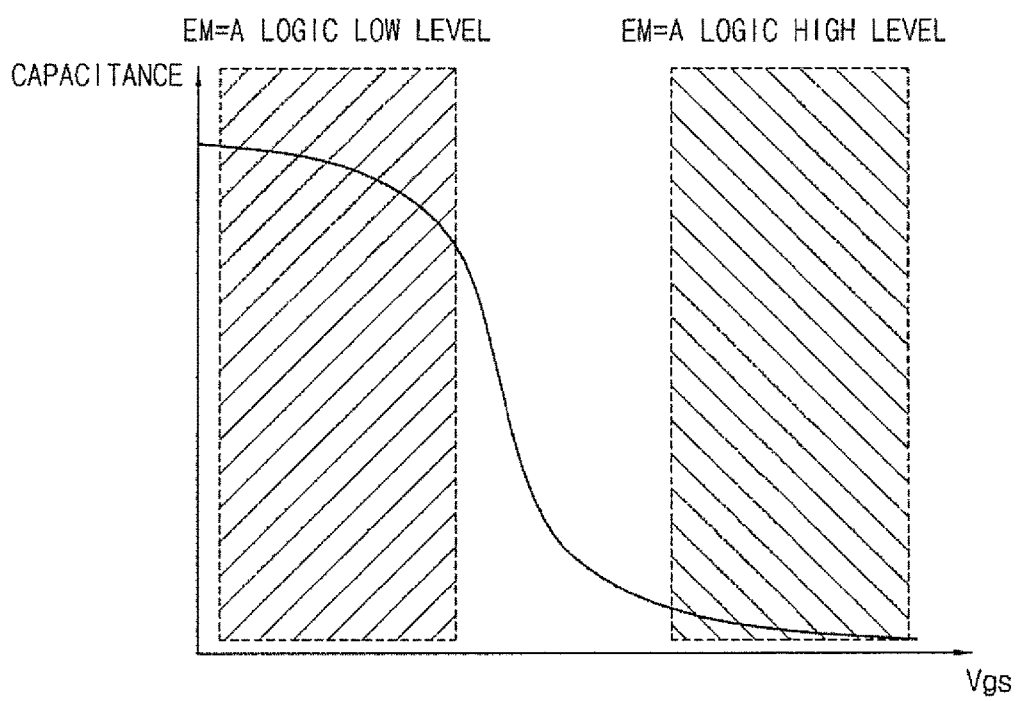
FIG. 5A is a diagram illustrating an operation of a MOS capacitor included in the light emission driving controller of FIG. 3.
Figure 5B:
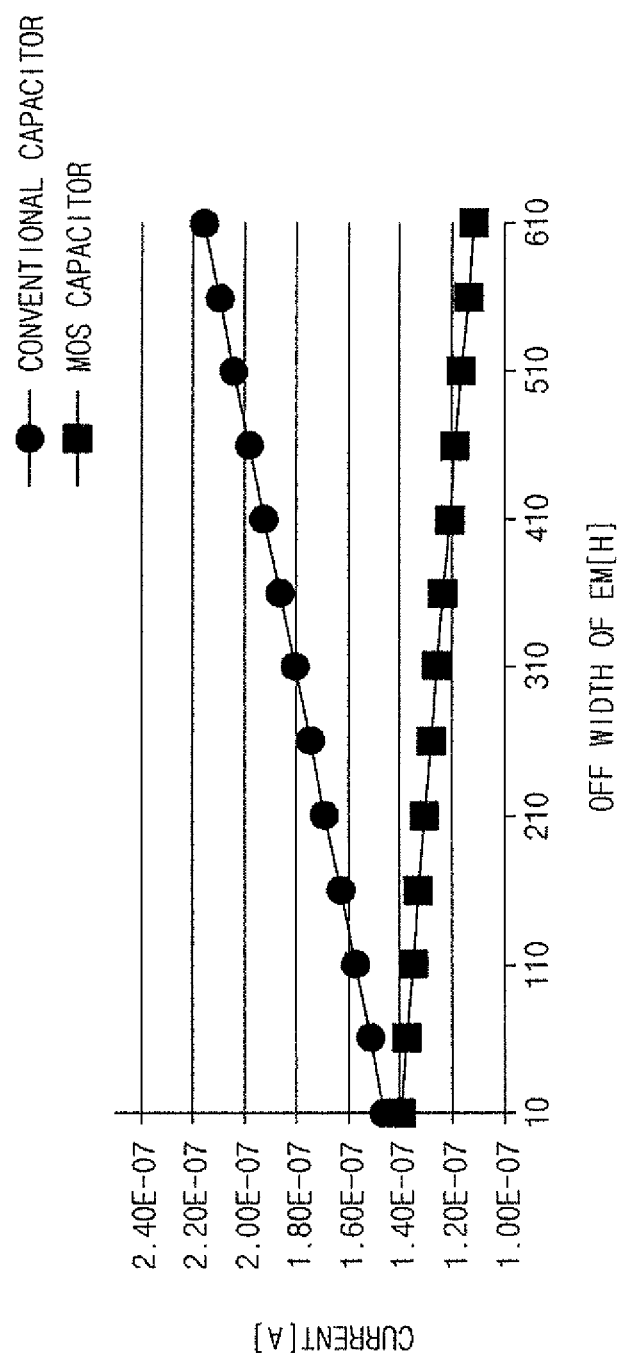
FIG. 5B is a diagram illustrating power consumption of the light emission driving controller of FIG. 3.

FIG. 5A is a diagram illustrating an operation of a MOS capacitor included in the light emission driving controller of FIG. 3. FIG. 5B is a diagram illustrating power consumption of the light emission driving controller of FIG. 3.

Referring to FIGS. 3, 5A and 5B, the MOS capacitor C3 may have a high capacitance when the light emission control signal EM has a logic low level. Because a voltage at the second node N2, having a logic low level, is provided to the gate electrode of the MOS capacitor C3 in response to the light emission control signal EM having a logic low level, a channel (e.g., a current path) of a transistor included in the MOS capacitor C3 may be formed. Therefore, the MOS capacitor C3 may perform as a capacitor.

Because a voltage at the second node N2, having a logic high level, is provided to the gate electrode of the MOS capacitor C3 in response to the light emission control signal EM having a logic high level, a channel (e.g., a current path) of a transistor included in the MOS capacitor C3 may not be formed. Therefore, the MOS capacitor C3 may not perform as a capacitor and power consumption due to a periodic reversal (or toggling) of the second clock signal CLK2 may be avoided.

Referring to FIG. 5B, as a logic high level period of the light emission control signal EM increases, a typical power consumption (i.e., power consumption of a typical emission driver) may increase. However, although a logic high level period of the light emission control signal EM increases, power consumption of the emission driver according to example embodiments may not increase, because the emission driver according to example embodiments may maintain a voltage at the second node N2 by using the MOS capacitor C3. Rather, the a logic high level period of the light emission control signal EM increases and power consumption of the emission driver according to example embodiments may decrease.

Figure 6:
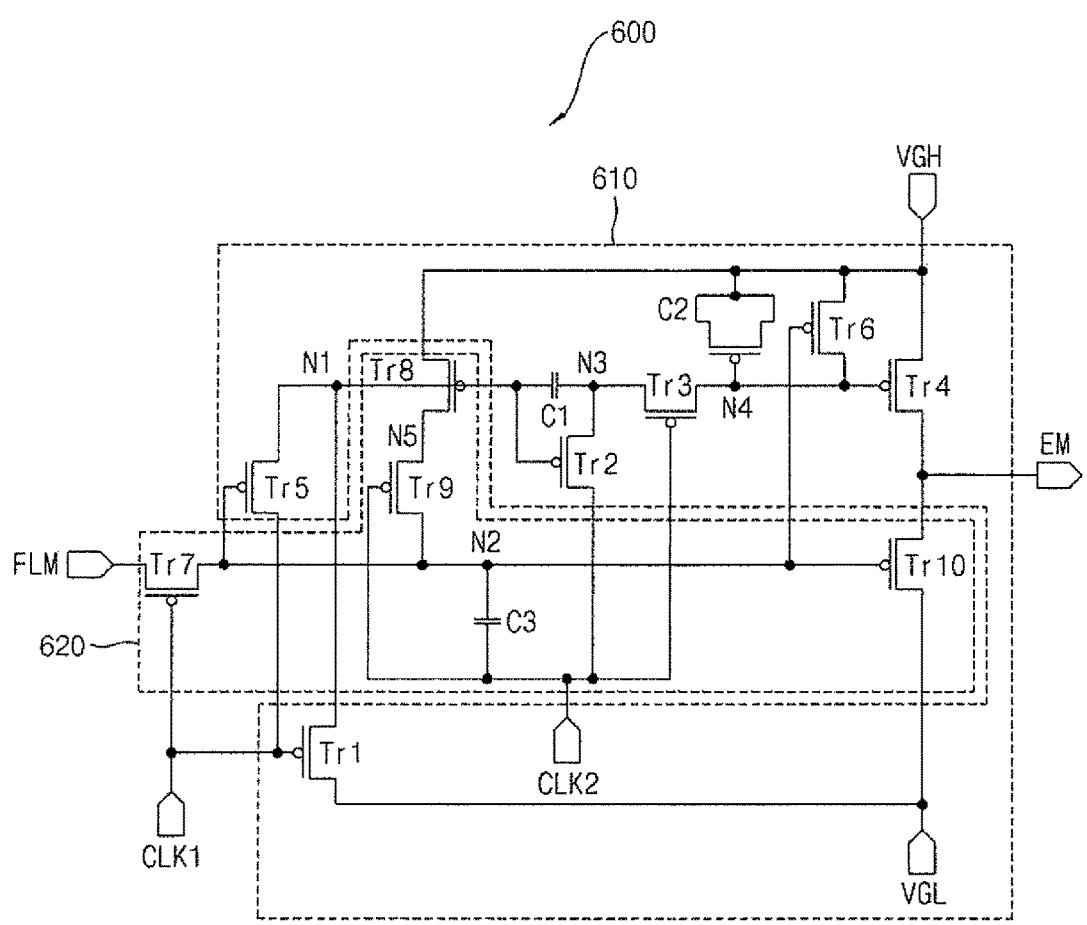
FIG. 6 is a circuit diagram illustrating an example of the light emission driving controller of FIG. 3.

FIG. 6 is a circuit diagram illustrating an example of the light emission driving controller of FIG. 3.

Referring to FIGS. 3 and 6, a light emission driving controller 600 may be the same as or similar to the light emission driving controller 210 except a configuration of a second capacitor C2. Therefore, duplicated description will not be repeated.

The light emission driving controller 600 may include a first circuit block 610 to charge a fourth node N4 with a second voltage VGL based on a first clock signal CLK1 and a second clock signal CLK2, to maintain a charged voltage at the fourth node N4 using a MOS capacitor C2, and to output a first voltage VGH as a light emission control signal EM based on the charged voltage at the fourth node N4, and a second circuit block 620 to provide a start signal FLM (or a synchronization signal) to a second node N2 in response to the first clock signal CLK1 and to pull down the light emission control signal EM to have the second voltage VGL in response to a voltage at the second node N2.

The MOS capacitor C2 may operate based on the charged voltage at the fourth node N4. For example, the MOS capacitor C2 may be implemented as a PMOS transistor. The MOS capacitor C2 may include a gate electrode that is electrically connected to the fourth node N4, a first electrode that receives the first voltage VGH, and a second electrode that receives the first voltage VGH. The MOS capacitor C2 may perform as a capacitor in response to the charged voltage at the fourth node N4 having a logic low level.

The first circuit block 610 may include a first transistor TR1 including a gate electrode that receives the first clock signal CLK1, a first electrode that receives the second voltage VGL, and a second electrode that is electrically connected to the first node N1, a first capacitor C1 electrically connected between the first node N1 and a third node N3, a second transistor TR2 including a gate electrode that is electrically connected to the first node N1, a first electrode that receives a second clock signal CLK2, and a second electrode that is electrically connected to the third node N3, a third transistor TR3 including a gate electrode that receives a second clock signal CLK2, a first electrode that is electrically connected to the third node N3, and a second electrode that is electrically connected to the fourth node N4, and a fourth transistor TR4 including a gate electrode that is electrically connected to the fourth node N4, a first electrode that receives the first voltage VGH, and a second electrode that is electrically connected to an output terminal of the light emission driving controller 600. Here, the MOS capacitor C2 may be electrically connected between the fourth node N4 and the first electrode of the fourth transistor TR4.

The first circuit block 610 may further include a fifth transistor TR5 including a gate electrode that is electrically connected to the second node N2, a first electrode that receives the first clock signal CLK1, and a second electrode that is electrically connected to the first node N1, and a sixth transistor TR6 including a gate electrode that is electrically connected to the second node N2, a first electrode that receives the second voltage VGL, and a second electrode that is electrically connected to the fourth node N4.

The second circuit block 620 may include a seventh transistor TR7 including a gate electrode that receives the first clock signal CLK1, a first electrode that receives a start signal FLM (or a synchronization signal), and a second electrode that is electrically connected to the second node N2, an eighth transistor TR8 including a gate electrode that is electrically connected to the first node N1, a first electrode that receives the first voltage VGH, and a second electrode that is electrically connected to a fifth node N5, a ninth transistor TR9 including a gate electrode that receives the second clock signal CLK2, a first electrode that is electrically connected to the fifth node N5, and a second electrode that is electrically connected to the second node N2, a third capacitor C3 electrically connected between the second node N2 and a terminal that receives the second clock signal CLK2, and a tenth transistor TR10 including a gate electrode that is electrically connected to the second node N2, a first electrode that receives the second voltage VGL, and a second electrode that is electrically connected to the output terminal of the light emission driving controller 600.

As described with reference to FIG. 5A, the second MOS capacitor C2 may perform no coupling operation when a voltage having a logic high level is provided to the fourth node N4.

Similar to the second capacitor C2 described with reference to FIGS. 3 and 4, the MOS capacitor C2 may perform no coupling operation in response to a voltage at the fourth node N4 having a logic high level. That is, the MOS capacitor C2 may maintain a voltage at the fourth node N4 to a logic low level after a fourth point t4.

Therefore, although the sixth transistor TR6 may be turned on in response to a voltage at the second node N2 having a logic low level, consumption of power may be avoided.

Alternatively, the light emission driving controller 600 uses a generally used capacitor instead of the MOS capacitor C2, the sixth transistor TR6 may be turned on in response to a voltage at the second node N2 having a logic low level and power may be consumed by the first voltage VGH through the sixth transistor TR6.

As described above, the light emission driving controller 600 according to example embodiments may include the MOS capacitor C2 electrically connected between the fourth node N4 and the first voltage VGH, and the MOS capacitor C2 may perform a coupling operation in response to a voltage at the fourth node N4. However, the MOS capacitor C2 may perform no operation in response to a voltage at the fourth node N4 having a logic high level. Therefore, power consumption may not increase even through the sixth transistor TR6 is turned on. In addition, a voltage at the fourth node N4 may be maintained with a logic low level because the MOS capacitor C2 may perform a coupling operation in response to a voltage at the fourth node N4 having a logic low level.

As shown in FIG. 6, a light emission driving controller is described. However, a configuration of maintaining a voltage at a gate electrode of a transistor outputting a certain signal by using the MOS capacitor C2 may be used in a scan driver. For example, the scan driver may include a first circuit block to output a scan signal based on a start signal, the first clock signal CLK1, and the second clock signal CLK2, and a second circuit block. Here, the first circuit block may include a capacitor to maintain a control voltage provided to a gate electrode of a pull-up transistor with a logic low level, and the capacitor may be implemented as a MOS capacitor. Similarly, the second circuit block may include a capacitor boosting a control voltage provided to a gate electrode of a pull-down transistor, and the capacitor may be implemented as a MOS capacitor.

The present inventive concept may be applied to any display device (e.g., an organic light emitting display device, a liquid crystal display device, etc.) that includes a scan driver (e.g., a gate driver). For example, the present inventive concept may be applied to a television, a computer monitor, a laptop, a digital camera, a cellular phone, a smart phone, a personal digital assistant (PDA), a portable multimedia player (PMP), an MP3 player, a navigation system, a video phone, etc.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such suitable modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. An emission driver comprising:
a plurality of light emission driving controllers electrically connected to light emission control lines, wherein each of the light emission driving controllers comprises:
a first circuit block configured to provide a first voltage to a first node in response to a first clock signal and to output a second voltage, distinct from the first voltage, as a light emission control signal based on a first node voltage at the first node and a second clock signal having a phase difference from a phase of the first clock signal; and
a second circuit block configured to provide a synchronization signal to a second node in response to the first clock signal, to maintain a second node voltage at the second node using a metal-oxide-semiconductor (MOS) capacitor, and to pull down the light emission control signal to have the first voltage in response to the second node voltage,
wherein the MOS capacitor is configured to perform a coupling operation based on the second node voltage, and
wherein the MOS capacitor comprises:
a gate electrode that is electrically connected to the second node;
a first electrode configured to receive the second clock signal; and
a second electrode configured to receive the second clock signal.

2. The emission driver of claim 1, wherein the MOS capacitor is a P-channel metal-oxide-semiconductor (PMOS) transistor.

3. The emission driver of claim 1, wherein the MOS capacitor is configured to operate when the second node voltage has a logic low level.

4. The emission driver of claim 1, wherein the first circuit block comprises:
a first transistor comprising:
a gate electrode configured to receive the first clock signal;
a first electrode configured to receive the first voltage; and
a second electrode that is electrically connected to the first node;
a first capacitor electrically connected between the first node and a third node;
a second transistor comprising:
a gate electrode that is electrically connected to the first node;
a first electrode configured to receive the second clock signal; and
a second electrode that is electrically connected to the third node;
a third transistor comprising:
a gate electrode configured to receive the second clock signal;
a first electrode that is electrically connected to the third node; and
a second electrode that is electrically connected to a fourth node;
a fourth transistor comprising:
a gate electrode that is electrically connected to the fourth node;
a first electrode configured to receive the second voltage; and
a second electrode that is electrically connected to an output terminal; and
a second capacitor electrically connected between the fourth node and the first electrode of the fourth transistor.

5. The emission driver of claim 4, wherein the first circuit block further comprises:
a fifth transistor comprising:
a gate electrode that is electrically connected to the second node;
a first electrode configured to receive the first clock signal; and
a second electrode that is electrically connected to the first node; and
a sixth transistor comprising:
a gate electrode that is electrically connected to the second node;
a first electrode configured to receive the second voltage; and
a second electrode that is electrically connected to the fourth node.

6. The emission driver of claim 4, wherein the second circuit block comprises:
a seventh transistor comprising:
a gate electrode configured to receive the first clock signal;
a first electrode configured to receive the synchronization signal; and
a second electrode that is electrically connected to the second node;
an eighth transistor comprising:
a gate electrode that is electrically connected to the first node;
a first electrode configured to receive the second voltage; and
a second electrode that is electrically connected to a fifth node;
a ninth transistor comprising:
a gate electrode configured to receive the second clock signal;
a first electrode that is electrically connected to the fifth node; and
a second electrode that is electrically connected to the second node; and
a tenth transistor comprising:
a gate electrode that is electrically connected to the second node;

a first electrode configured to receive the first voltage; and a second electrode that is electrically connected to the output terminal, wherein the MOS capacitor is electrically connected between the second node and a terminal configured to receive the second clock signal.

7. The emission driver of claim 4, wherein the second capacitor is a MOS capacitor.

8. The emission driver of claim 7, wherein the MOS capacitor is a PMOS transistor.

9. The emission driver of claim 7, wherein the second capacitor comprises:
a gate electrode that is electrically connected to the fourth node;
a first electrode configured to receive the second voltage; and
a second electrode configured to receive the second voltage.

10. An emission driver comprising:
a plurality of light emission driving controllers that are electrically connected to light emission control lines, wherein each of the light emission driving controllers comprises:
a first circuit block configured to charge a first node with a first voltage based on a first clock signal and a second clock signal having a phase difference from a phase of the first clock signal, to maintain a first node voltage at the first node using a metal-oxide-semiconductor (MOS) capacitor, and to output a second voltage, distinct from the first voltage, as a light emission control signal based on the first node voltage; and
a second circuit block configured to provide a synchronization signal to a second node in response to the first clock signal and to pull down the light emission control signal to have the first voltage in response to a second node voltage at the second node,
wherein the MOS capacitor operates based on the first node voltage, and
wherein the MOS capacitor comprises:
a gate electrode that is electrically connected to the first node;
a first electrode configured to receive the second voltage; and
a second electrode configured to receive the second voltage.

11. The emission driver of claim 10, wherein the MOS capacitor is a P-channel metal-oxide-semiconductor (PMOS) transistor.

12. The emission driver of claim 10, wherein the MOS capacitor operates when the first node voltage has a logic low level.

13. The emission driver of claim 10, wherein the first circuit block comprises:
a first transistor comprising:
a gate electrode configured to receive the first clock signal;
a first electrode configured to receive the first voltage; and
a second electrode that is electrically connected to a third node;
a first capacitor electrically connected between the third node and a fourth node;
a second transistor comprising:
a gate electrode that is electrically connected to the third node;
a first electrode configured to receive the second clock signal; and
a second electrode that is electrically connected to the fourth node;
a third transistor comprising:
a gate electrode configured to receive the second clock signal;
a first electrode that is electrically connected to the fourth node; and
a second electrode that is electrically connected to the first node; and
a fourth transistor comprising:
a gate electrode that is electrically connected to the first node;
a first electrode configured to receive the second voltage; and
a second electrode that is electrically connected to an output terminal,
wherein the MOS capacitor is electrically connected between the first node and the first electrode of the fourth transistor.

14. The emission driver of claim 13, wherein the first circuit block further comprises:
a fifth transistor comprising:
a gate electrode that is electrically connected to the second node;
a first electrode configured to receive the first clock signal; and
a second electrode that is electrically connected to the third node; and
a sixth transistor comprising:
a gate electrode that is electrically connected to the second node;
a first electrode configured to receive the second voltage; and
a second electrode that is electrically connected to the first node.

15. The emission driver of claim 13, wherein the second circuit block comprises:
a seventh transistor comprising:
a gate electrode configured to receive the first clock signal;
a first electrode configured to receive the synchronization signal; and
a second electrode that is electrically connected to the second node;
an eighth transistor comprising:
a gate electrode that is electrically connected to the third node;
a first electrode configured to receive the second voltage; and
a second electrode that is electrically connected to a fifth node;
a ninth transistor comprising:
a gate electrode configured to receive the second clock signal;
a first electrode that is electrically connected to the fifth node; and
a second electrode that is electrically connected to the second node;
a third capacitor electrically connected between the second node and a terminal configured to receive the second clock signal; and
a tenth transistor comprising:
a gate electrode that is electrically connected to the second node;

a first electrode configured to receive the first voltage; and a second electrode that is electrically connected to the output terminal.

16. A display device comprising:
a display panel comprising a plurality of light emission control lines and a plurality of pixels electrically connected to the light emission control lines; and
a plurality of light emission driving controllers electrically connected to the light emission control lines, respectively, wherein each of the light emission driving controllers comprises:
   a first circuit block configured to provide a first voltage to a first node in response to a first clock signal and to output a second voltage, distinct from the first voltage, as a light emission control signal based on a first node voltage at the first node and a second clock signal having a phase difference from a phase of the first clock signal; and
   a second circuit block configured to provide a synchronization signal to a second node in response to the first clock signal, to maintain a second node voltage at the second node using a MOS capacitor, and to pull down the light emission control signal to have the first voltage in response to the second node voltage,
wherein the MOS capacitor is configured to perform a coupling operation based on the second node voltage, and
wherein the MOS capacitor comprises:
   a gate electrode that is electrically connected to the second node;
   a first electrode configured to receive the second clock signal; and
   a second electrode configured to receive the second clock signal.

* * * * *